(12) United States Patent
Tsukamoto

(10) Patent No.: US 7,061,573 B2
(45) Date of Patent: Jun. 13, 2006

(54) CONTAMINATION PREVENTION IN OPTICAL SYSTEM

(75) Inventor: Masami Tsukamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 298 days.

(21) Appl. No.: 09/829,915

(22) Filed: Apr. 11, 2001

(65) Prior Publication Data
US 2002/0000519 A1 Jan. 3, 2002

(30) Foreign Application Priority Data
Apr. 14, 2000 (JP) .............................. 2000-113505

(51) Int. Cl.
*G03B 27/52* (2006.01)
*G03B 27/54* (2006.01)

(52) U.S. Cl. .......................................... 355/30; 355/67

(58) Field of Classification Search ................. 355/30, 355/53, 67, 77; 359/362; 356/399, 239.2; 399/4, 32, 51
See application file for complete search history.

(56) References Cited

U.S. PATENT DOCUMENTS

| 5,425,045 | A | * | 6/1995 | Hamatani | |
| 5,559,584 | A | | 9/1996 | Miyaji et al. ................. 355/73 |
| 5,696,623 | A | * | 12/1997 | Fujie et al. ................. 359/350 |
| 5,883,704 | A | * | 3/1999 | Nishi et al. | |
| 5,892,572 | A | * | 4/1999 | Nishi | |
| 5,995,263 | A | * | 11/1999 | Tokuda et al. .............. 359/196 |
| 6,252,648 | B1 | | 6/2001 | Hase et al. .................... 355/53 |
| 6,496,257 | B1 | * | 12/2002 | Taniguchi et al. ....... 356/239.2 |
| 6,630,985 | B1 | | 10/2003 | Hase .......................... 355/30 |

| 2001/0028477 | A1 | 10/2001 | Ishimoto et al. ............ 358/471 |
| 2001/0055326 | A1 | 12/2001 | Miwa et al. .................. 372/57 |
| 2002/0149753 | A1 | 10/2002 | Hase .......................... 355/30 |

FOREIGN PATENT DOCUMENTS

| JP | 2-250309 | 10/1990 |
| JP | 6-260385 | 9/1994 |
| JP | 8-45827 | 2/1996 |
| JP | 10-242029 | 9/1998 |
| JP | 11-145053 | 5/1999 |
| JP | 11-195576 | 7/1999 |
| JP | 11-195583 | 7/1999 |
| JP | 11-224839 | 8/1999 |
| JP | 2001-284213 | 10/2001 |

OTHER PUBLICATIONS

Stroebel and Zakia, Encyclopedia of Photography, Focal Press, 3rd Edition, p. 52.*
Japanese Office Action dated Sep. 1, 2003, and issued on Sep. 3, 2003, in corresponding Japanese patent appln. No. 2000-113505, with partial English translation.

* cited by examiner

Primary Examiner—Rodney Fuller
(74) Attorney, Agent, or Firm—Fitzpatrick, Cella, Harper & Scinto

(57) ABSTRACT

An exposure apparatus for illuminating a pattern with light from a light source and for exposing a predetermined surface with light from the pattern includes (i) a projection optical system for projecting the pattern onto the predetermined surface, the projection optical system having at least one optical element having optical surfaces, and (ii) a gas supplying device for locally supplying a gas to the at least one optical element. In one aspect, the gas supplying device directly blows the gas toward one of the optical surfaces of the at least one optical element, which is closest to the predetermined surface, from the predetermined surface side.

26 Claims, 6 Drawing Sheets

CONTAMINATION PREVENTION IN OPTICAL SYSTEM

FIELD OF THE INVENTION AND RELATED ART

This invention relates to an optical structure and a method of preventing contamination of an optical structure. More particularly, the invention concerns a technology suitably usable in an optical structure, particularly, a semiconductor exposure apparatus, for example, which uses a wavelength of light in an ultraviolet region as a light source, for effectively preventing contamination of a surface of an optical element isolated from a surrounding ambience, the surface being at the ambience side.

Semiconductor integrated circuits have become more and more miniaturized year after year, and, in order to meet this, exposure apparatuses for transferring a circuit pattern onto a wafer are required to have a performance capable of transferring a finer pattern. Thus, the wavelength of exposure light used in such exposure apparatuses becomes shorter and shorter. Currently, i-line (wavelength 365 nm) or KrF excimer laser light (wavelength 245 nm) are used widely. Further, use of ArF excimer laser light (wavelength 193 nm) has been started, and use of $F_2$ laser light has been attempted.

Generally, such exposure apparatuses have a structure that ultraviolet light from a lamp or a laser goes through a beam shaping unit and, by means of an illumination optical system which includes secondary light sources and a lens or mirror system, the light is transformed into light having a desired shape and a luminance distribution, by which a reticle is illuminated. A circuit pattern formed on the reticle is reduced at a desired magnification, through a projection optical system, and is transferred to a wafer.

As regards optical elements in exposure apparatuses such as lenses or mirrors, for example, there frequently occurs adhesion of depositions on the surface of an optical element due to impurities contained in a surrounding ambience. It is known that, typically, ammonium sulfate or silicon dioxide, for example, is deposited on the surface of an optical element. The product source, inside a clean room, may be ammonia vapor produced from a concrete, sulfuric acid used for removal of a resist, sulfur oxides usually contained in an atmosphere, or silicon resin used in a wall material or floor material. Inside an exposure apparatus, on the other hand, the source may be hexamethyldisilazane (HMDS), for example, used as a contact enhancing agent with a resist. In order to remove these impurities contained in the air inside the clean room or in the exposure apparatus, a filter or the like may be provided in an air circulating mechanism, for example. However, there are many structural components, other than optical elements, disposed inside the exposure apparatus. Further, a gas produced from a resist may be a source of depositions. For these reasons, it is very difficult to completely remove impurity gases which cause depositions. In consideration of this, optical elements in each unit are accommodated in a container so that they are isolated from a surrounding exposure apparatus chamber ambience, and the inside of the container is purged by a gas not containing impurities, to prevent contamination of the optical elements.

However, it is practically difficult to purge the entire path of exposure light. Particularly, in the neighborhood of a reticle or a wafer, there is a stage which is movable. Therefore, it is difficult to separate only the light path from the surrounding ambience and to purge the same. Further, there are cases wherein the light path between adjacent units extends through a surrounding ambience. In addition, while there are optical elements provided at a light entrance port and a light exit port of each container, containing a unit of optical elements, the surfaces of these optical elements facing the surrounding ambience are exposed directly to the ambience and, therefore, depositions may be adhered to them. This leads to degradation of the optical performance, such as a decrease of illuminance, for example, and thus it causes a necessity of periodic washing or replacement.

Particularly, one of optical elements of a projection optical system which is closest to a wafer is directly exposed to a gas produced from a resist. As a result, the transmission factor of it decreases most. In order to avoid this, a gas may be caused to flow in one direction, along a space between a wafer and a lens, such as shown in FIG. 2. Here, in exposure apparatuses, any fluctuation in an ambience is adversely influential to the imaging performance. Further, in scan type exposure apparatuses, since a stage moves, a gas from a resist is easily mixed. It is, therefore, very difficult to decrease the impurity concentration at the lens surface effectively.

In these methods, a gas product from a wafer is rather conveyed to the lens surface, along the gas flow, such that sufficient contamination prevention is not attainable. Japanese Laid-Open Patent Application, Laid-Open No. 260385/1994 shows a method in which an inactive gas is supplied through a supply port provided on a stage, in parallel to a wafer and, simultaneously, a gas is supplied toward the wafer from the bottom end of a projection optical system, in parallel to the optical axis. This method has paid particular note to an oxygen concentration in the space from the projection optical system to the wafer, but the efficiency itself regarding contamination prevention at the bottom face of the projection optical system is not so good. Between a projection lens and the surface of a wafer, measurement light for measuring the imaging position passes. Any change in temperature or pressure of an ambience in the space through which the measurement light passes leads to a measurement error, and this applies a large influence to the position adjustment for the wafer imaging position. Further, a change in temperature or pressure of the ambience is also influential to the imaging performance. For these reasons, the flow of a gas of a large flow rate or any fluctuation in pressure or temperature causes an error of the wafer position adjustment and degradation of the imaging performance.

SUMMARY OF THE INVENTION

It is accordingly an object of the present invention to provide an optical structure and/or a method of preventing contamination of the same, in which a clean gas is supplied efficiently to the surface, or in the neighborhood thereof, of an optical element being isolated from a surrounding ambience, thereby to keep the surface clean and to prevent adhesion of depositions thereon. This assures minimization of the influence of the gas flow to the imaging performance and adjustment of the imaging position, for example, such that contamination of the optical element can be prevented with a very small amount of gas flow.

In accordance with an aspect of the present invention, there is provided an optical structure, comprising: an optical element; and gas supplying means for supplying a gas to a limited portion of a surface of the optical element, wherein said gas supplying means blows the gas directly against the surface of the optical element.

In one preferred form of this aspect of the present invention, light to be incident on said optical structure may be ultraviolet light.

The light may have one of wavelengths of 365 nm, 245 nm, 193 nm and 157 nm.

The optical structure may further comprise a plurality of optical elements and a container isolated from a surrounding ambience, wherein said plurality of optical elements may be disposed at least at a light entrance surface and a light exit surface of said container, and wherein said gas supplying means may be provided at the light entrance surface and/or the light exit surface of said container.

There may be a plurality of gas supplying means, each being said gas supplying means, which may be disposed revolutionally symmetrically with respect to an optical axis of the optical element.

The optical structure may further comprise a cover for suppressing diffusion of the gas supplied by said gas supplying means to the limited portion of the surface of the optical element.

The gas supplying means may include means for removing an impurity contained in the gas to be supplied to the limited portion of the surface of the optical element.

The optical structure may further comprise a gas supplying equipment having impurity removing means, for supplying a gas to said gas supplying means.

The gas supplied by said gas supplying means may be an inactive gas.

The gas supplied by said gas supplying means may be an atmosphere, wherein, after an impurity contained is removed by impurity removing means, the gas may be supplied by said gas supplying means.

The optical structure may further comprise means for adjusting a gas supplying flow rate and a pressure of the gas to be supplied by said gas supplying means, in accordance with the state of use of said optical structure.

The optical structure may further comprise means for adjusting a temperature of the gas to be supplied by said gas supplying means.

The optical structure may further comprise gas exhausting means for exhausting the gas supplied by said gas supplying means.

There may be a plurality of gas exhausting means disposed revolutionally symmetrically with respect to an optical axis of the optical element.

The gas supplying means may be disposed at one side of the optical element, and said gas exhausting means may be disposed at the other side of the optical element.

The optical structure may further comprise means for adjusting a gas discharging flow rate and a pressure of the gas to be exhausted by said gas exhausting means, in accordance with the state of use of said optical structure.

The optical structure may further comprise (i) a plurality of optical elements, (ii) a plurality of gas supplying means each being said gas supplying means and disposed revolutionally symmetrically with respect to an optical axis of the optical element, (iii) a container isolated from a surrounding ambience, wherein said plurality of optical elements may be disposed at least at a light entrance surface and a light exit surface of said container, and (iv) a cover for covering the light entrance surface and/or the light exit surface of said container, wherein said plurality of gas supplying means may be provided inside said cover.

The optical structure may further comprise (i) a plurality of optical elements, (ii) a plurality of gas supplying means each being said gas supplying means and disposed revolutionally symmetrically with respect to an optical axis of the optical element, (iii) a plurality of gas exhausting means each being said gas exhausting means and disposed revolutionally symmetrically with respect to the optical axis of the optical element, (iv) a container isolated from a surrounding ambience, wherein said plurality of optical elements may be disposed at least at a light entrance surface and a light exit surface of said container, and (v) a cover for covering the light entrance surface and/or the light exit surface of said container, wherein said plurality of gas supplying means and said plurality of gas exhausting means may be provided inside said cover.

In accordance with another aspect of the present invention, there is provided an exposure apparatus for illuminating a pattern with light from a light source and for projecting light from the pattern onto a surface to be exposed, said apparatus comprising: an optical structure as recited above, wherein the light from the light source is light of an ultraviolet region.

In one preferred form of this aspect of the present invention, the light may have one of wavelengths of 365 nm, 245 nm, 193 nm and 157 nm.

The gas supplying means may blow the gas against an optical element disposed opposed to the surface to be exposed.

In accordance with a further aspect of the present invention, there is provided a device manufacturing method, comprising the steps of: exposing a wafer with a pattern by use of an exposure apparatus as recited above; and developing the exposed wafer.

In accordance with a yet further aspect of the present invention, there is provided an optical structure, comprising: an optical element; and a gas supplying means for supplying a gas to a surface of the optical element, wherein the gas supplied to the surface of the optical element defines a laminar flow at and adjacent to the surface of the optical element.

In one preferred form of this aspect of the present invention, light to be incident on said optical structure may be ultraviolet light.

The light may have one of wavelengths of 365 nm, 245 nm, 193 nm and 157 nm.

The optical structure may further comprise a plurality of optical elements and a container isolated from a surrounding ambience, wherein said plurality of optical elements may be disposed at least at a light entrance surface and a light exit surface of said container, and wherein said gas supplying means may be provided at the light entrance surface and/or the light exit surface of said container.

There may be a plurality of gas supplying means, each being said gas supplying means, which may be disposed along a direction substantially perpendicular to a gas supplying direction of said gas supplying means.

The optical structure may further comprise a cover for suppressing diffusion of the gas supplied by said gas supplying means to a limited portion of the surface of the optical element.

The gas supplying means may include means for removing an impurity contained in the gas to be supplied to a limited portion of the surface of the optical element.

The optical structure may further comprise gas supplying equipment having impurity removing means, for supplying a gas to said gas supplying means.

The gas supplied by said gas supplying means may be an inactive gas.

The gas supplied by said gas supplying means may be an atmosphere and wherein, after an impurity contained is removed by impurity removing means, the gas may be supplied by said gas supplying means.

The optical structure may further comprise means for adjusting a gas supplying flow rate and a pressure of the gas to be supplied by said gas supplying means, in accordance with the state of use of said optical structure.

The optical structure may further comprise means for adjusting a temperature of the gas to be supplied by said gas supplying means.

The optical structure may further comprise gas exhausting means for exhausting the gas supplied by said gas supplying means.

There may be a plurality of gas exhausting means disposed along a direction perpendicular to a direction in which the gas may be discharged by said gas exhausting means.

The gas supplying means may be disposed at one side of the optical element, and said gas exhausting means may be disposed at the other side of the optical element.

The optical structure may further comprise means for adjusting a gas discharging flow rate and a pressure of the gas to be exhausted by said gas exhausting means, in accordance with the state of use of said optical structure.

The optical structure may further comprise (i) a plurality of optical elements, (ii) a plurality of gas supplying means disposed along a direction substantially perpendicular to a direction in which the gas is to be supplied, (iii) a container isolated from a surrounding ambience, wherein said plurality of optical elements may be disposed at least at a light entrance surface and a light exit surface of said container, and (iv) a cover for covering the light entrance surface and/or the light exit surface of said container, wherein said plurality of gas supplying means may be provided inside said cover.

The optical structure may further comprise (i) a plurality of optical elements, (ii) a plurality of gas supplying means disposed along a direction substantially perpendicular to a direction in which the gas is to be supplied, (iii) a plurality of gas exhausting means disposed along a direction substantially perpendicular to a direction in which the gas is discharged, (iv) a container isolated from a surrounding ambience, wherein said plurality of optical elements may be disposed at least at a light entrance surface and a light exit surface of said container, and (v) a cover for covering the light entrance surface and/or the light exit surface of said container, wherein said plurality of gas supplying means and said plurality of gas exhausting means may be provided inside said cover.

In accordance with a still further aspect of the present invention, there is provided an exposure apparatus for illuminating a pattern with light from a light source and for projecting light from the pattern onto a surface to be exposed, said apparatus comprising: an optical structure as recited above; wherein the light from the light source is light of ultraviolet region.

In one preferred form of this aspect of the present invention, the light may have one of wavelengths of 365 nm, 245 nm, 193 nm and 157 nm.

The gas supplying means may blow the gas against an optical element disposed opposed to the surface to be exposed.

In accordance with a still further aspect of the present invention, there is provided a device manufacturing method, comprising the steps of: exposing a wafer with a pattern by use of an exposure apparatus as recited above; and developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B show a first embodiment of the present invention, wherein

FIG. 1A is a schematic and sectional view of a projection barrel and

FIG. 1B is a schematic view of the bottom of the barrel.

DESCRIPTION OF THE PREFERRED EMBODIMENTS

In the preferred embodiments of the present invention to be described below, the arrangements described above are applied by which a gas which may contain only a very small quantity of impurities, causing depositions, can be blown against a limited portion of the surface of an optical element, facing a surrounding ambience, or can be caused to flow to produce a laminar flow. Thus, an ambience with a very small quantity of impurities can be produced adjacent to the surface of the optical element, and adhesion of deposition thereto can be suppressed. As a result, contamination of the surface of the optical element, facing the surrounding ambience, can be prevented efficiently.

Further, gas supply ports and gas discharging ports may be provided symmetrically. This enables a revolutionally symmetrical gas flow, such that the influence to the imaging performance is small and that the impurity concentration at the lens surface can be decreased effectively.

A gas supply port may be provided at one side of the lens surface while a gas discharging port may be disposed at the opposite side of the lens surface, so that a gas flows along the lens surface. This enables that a clean ambience is locally produced at the lens surface only by use of a small flow rate of the gas.

Preferred embodiments of the present invention will now be described with reference to the accompanying drawings.

Embodiment 1

Figure 1A:
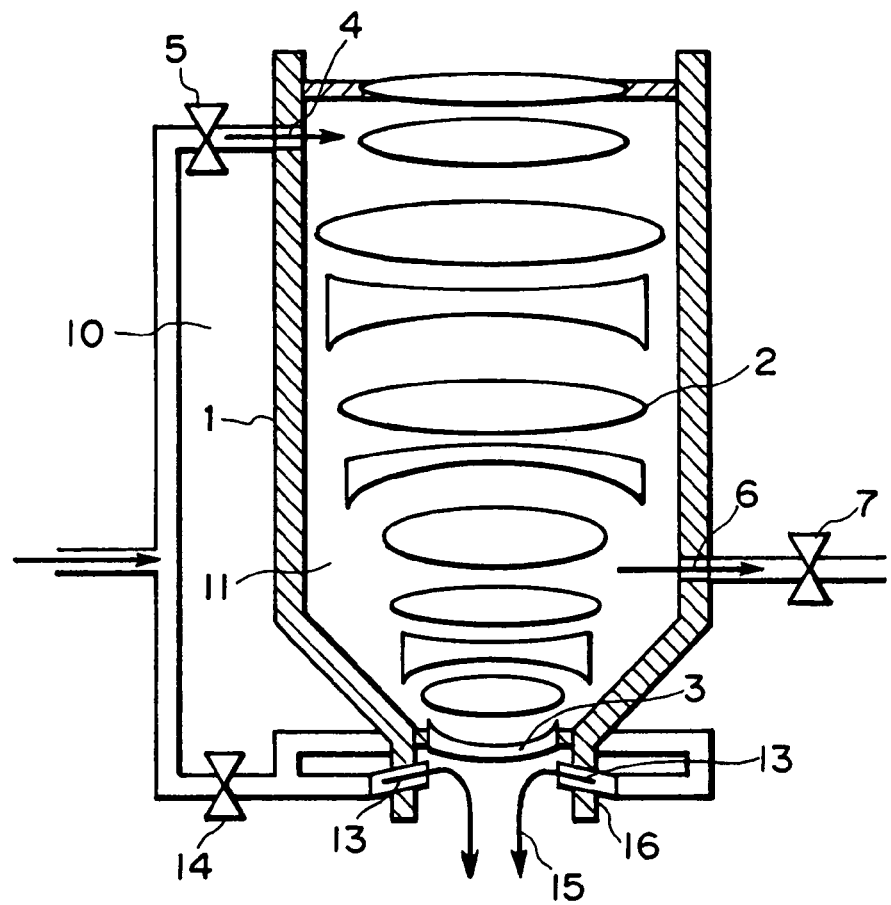
Figure 1B:
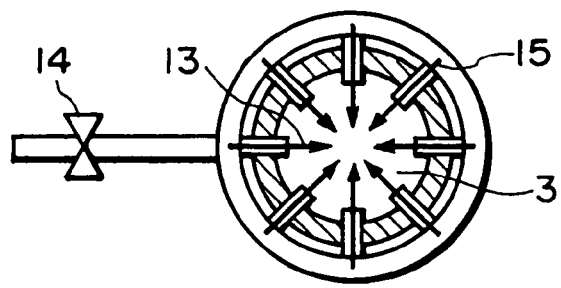
Figure 2:
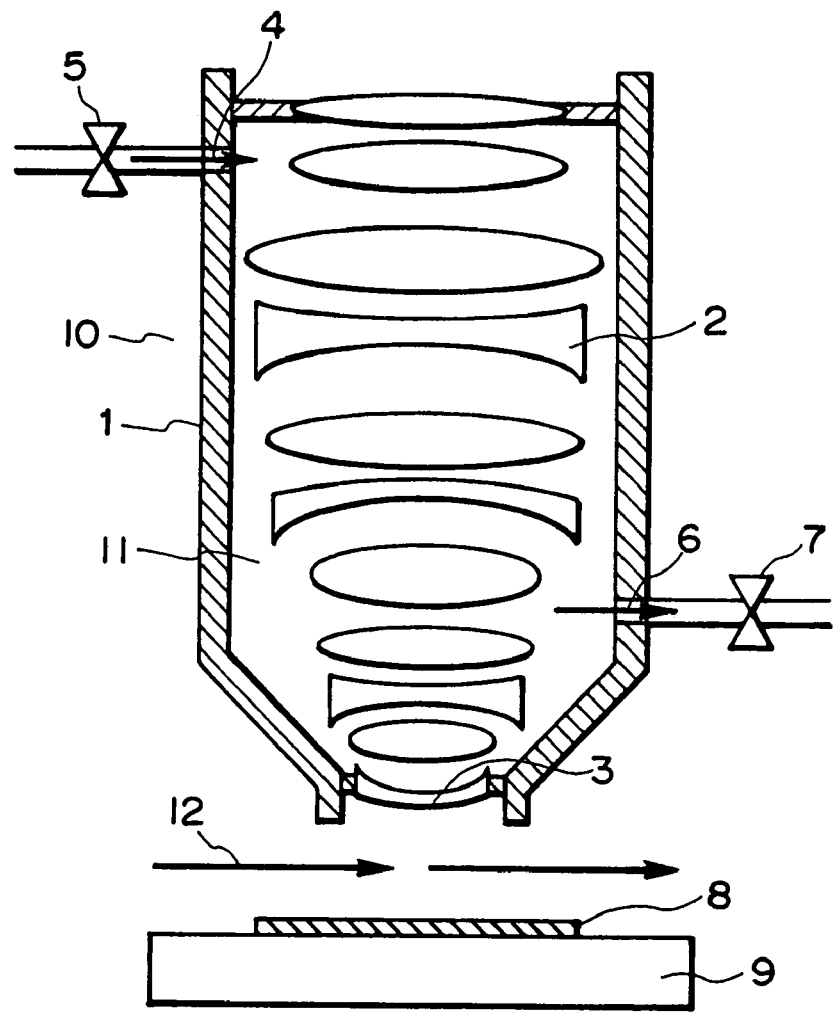
FIG. 2 is a schematic and sectional view of a conventional example.

FIGS. 1A and 1B are schematic views of a first embodiment of the present invention. This is a typical example of the present invention as applied to a bottom lens of a projection system in a semiconductor exposure apparatus. FIG. 1A is a schematic and sectional view of a projection barrel and FIG. 1B is a schematic view of the bottom of the barrel.

As shown in FIG. 1A, the projection system of the semiconductor exposure apparatus comprises a plurality of lenses 2. The whole optical system is accommodated in a barrel 1 which is closed (and purged) so that an ambient gas in a chamber ambience enters into the barrel. Along the light path, the top of the projection system, that is, the lens closest to a reticle, and the bottom of the projection lens, that is, the lens 3 closest to a wafer, serve to intercept the ambience.

The barrel is provided with a gas supply port 4 and a gas discharging port 6 so that a clean gas without containing impurities can be supplied to the inside of the barrel.

However, one face of the top-most lens and one face of the bottom lens are exposed to be the ambience of the exposure apparatus chamber. In consideration of it, a plurality of gas supply ports 13 are provided around the bottom-most lens of the projection system, about the lens optical axis, to surround the lens.

Gases 15 discharged from these gas supply ports flow along the lens surface toward the center of the lens. Adjacent to the center, the gases flow as a downward stream, and they are diffused. In order to produce an effective flow, the flow rate and the flow speed, for example, should be controlled. To this end, an optimum shape of the discharging port 15 as well as an optimum flow rate and pressure of the gas are determined in accordance with the shape and size of the lens, for example.

Further, in order to prevent mixture of a surrounding ambient gas and to aid the flow of the supplied gas, a cover 16 may effectively be provided at the lens bottom surface.

As regards the gas to be used, it should be a clean gas free from contamination causal substances. Since organic substances, SOx, NOx, ammonia and the like are sources of contamination, an organic substance removing filter for removing these organic substances or, alternatively, a chemical filter for removing inorganic substances, may be used as required.

Exposure apparatuses may be individually equipped with impurity removing devices such as filters. However, a gas supplied from a factory or experimental equipment, having an impurity removing function, may be used.

The type of gas to be used may be chosen in accordance with the wavelength of ultraviolet rays, for example, to be used in the exposure apparatus. An atmosphere may be used where i-line or a KrF laser is used. When light of a shorter wavelength is used, an inactive gas such as nitrogen or He, for example, may be used. When an inactive gas is supplied directly from a commercially available high purity cylinder, for example, since substantially no impurity is contained therein, the impurity removing device may be omitted.

With the procedure described above, there occurs substantially no adhesion of depositions on the lens surface. Since the gas is supplied toward a limited area on the lens surface, there arises substantially no influence to the wafer position measurement. In the case of a scan type exposure apparatus, the influence of resist gas diffusion due to the motion of the wafer stage, for example, can be made small.

A valve 14 for adjusting the flow rate of the supplied gas may be controlled so as to adjust the gas flow rate in accordance with the state of exposure operation. This enables a more effective supply of a clean gas to the lens surface. For example, during an alignment process, during an imaging position measuring process or during an exposure process, the flow of a gas applies a large influence to the imaging performance. Therefore, the gas flow rate should be restricted. On the other hand, during a wafer conveying process, for example, the gas flow can be increased. Thus, when a new wafer is conveyed onto a wafer stage, the supplying flow rate may be increased, thereby to effectively remove an impurity gas, produced from a resist, away from the lens. During the alignment and exposure process, the flow rate may be decreased to prevent adverse influence to the imaging performance.

Figure 3:
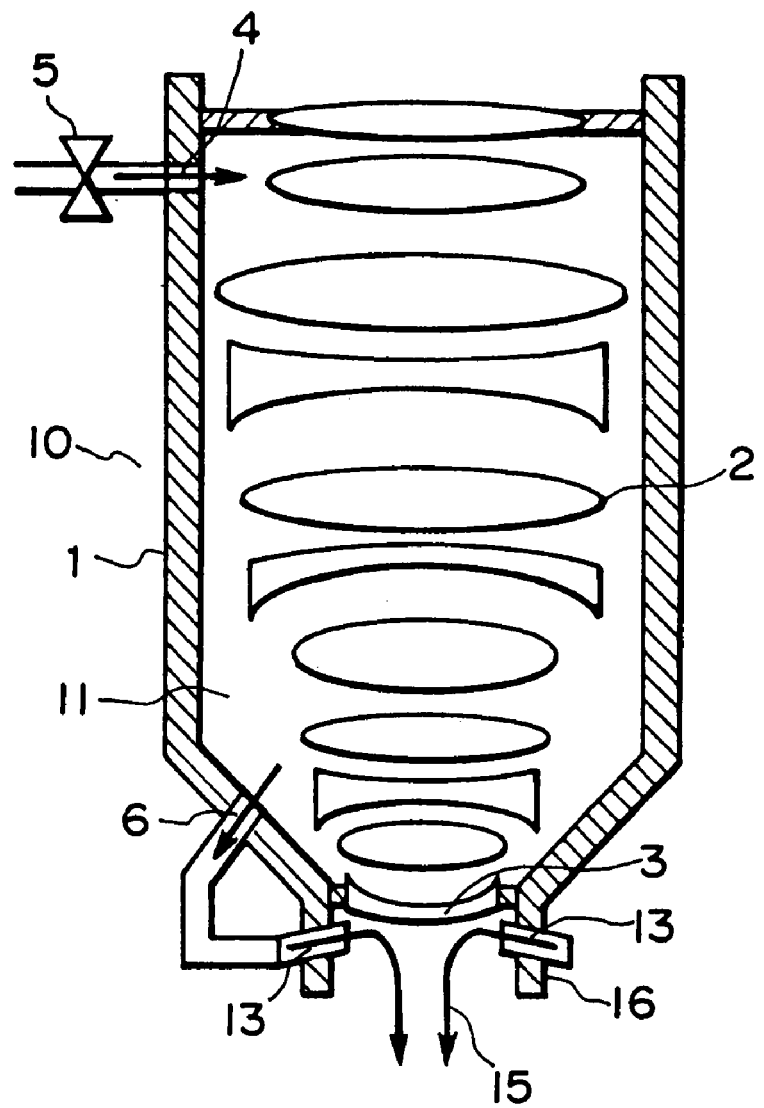
FIG. 3 is a schematic and sectional view of another example according to the first embodiment of the present invention.

When a gas of the same type as that of the gas used inside the barrel can be used and caused to flow along the lens surface, as shown in FIG. 3, the gas may be supplied from a gas discharging port of the projection barrel.

Embodiment 2

Figure 4:
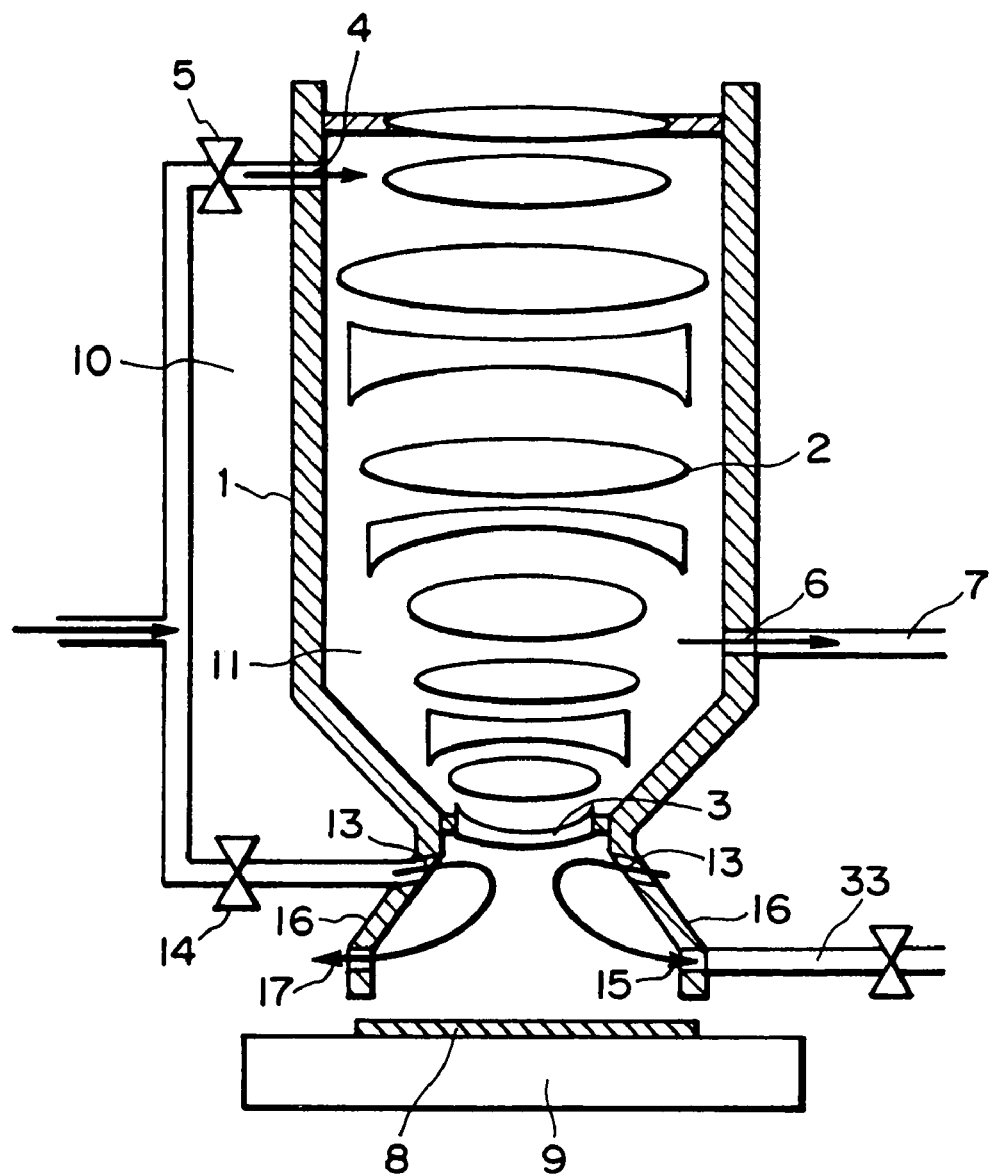
FIG. 4 is a schematic and sectional view of a second embodiment of the present invention.

FIG. 4 is a schematic view of a second embodiment of the present invention. In the gas supplying method of the first embodiment, there may be cases wherein, depending on the size or shape of the lens, for example, the gas that flows form the lens to the wafer surface is diffused of a resist gas. In consideration of it, as shown in FIG. 4, a gas discharging port 17 may be provided below the supply port. This is effective to produce a gas flow.

Also, in this case, there may be a plurality of gas discharging ports disposed revolutionally symmetrically with respect to the optical axis, like the gas supply ports.

Further, the shape and position of these gas supply ports and gas discharging ports should be determined so that the gas flows appropriately. Moreover, the gas supplying pressure and flow rate as well as the gas discharging pressure from the gas discharging port should be adjusted appropriately. The pressure inside the projection barrel is maintained constant, and usually, the pressure difference thereof with the surrounding ambience is small. As compared therewith, from the gas discharging port 17, the gas should be discharged with a pressure difference of a certain level or more, with respect to the surrounding ambience. In consideration of this, an exhausting system 33 separate from the projection barrel may be provided as required.

Embodiment 3

Figure 5A:
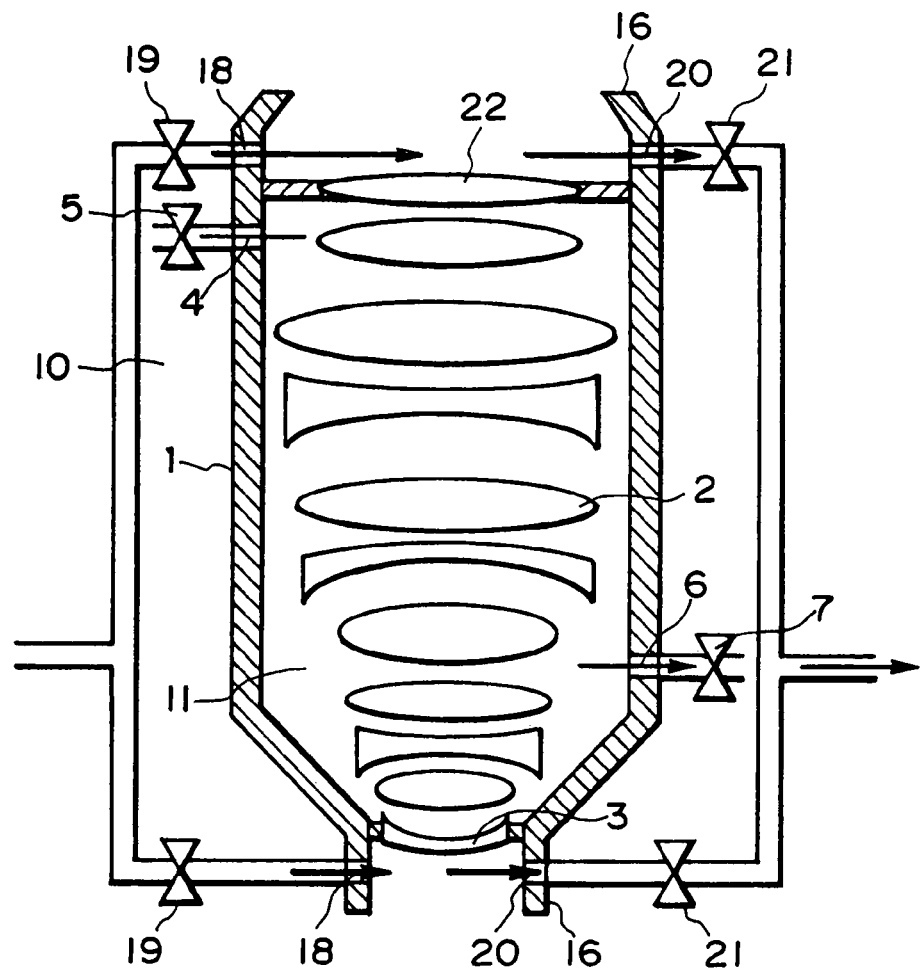
FIGS. 5A and 5B are schematic and sectional views of a third embodiment of the present invention.
Figure 5B:
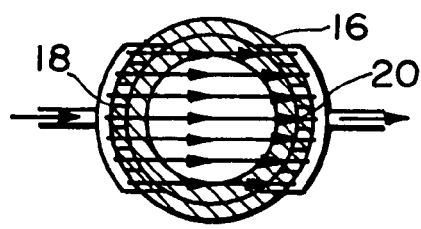

FIGS. 5A and 5B are schematic views of a third embodiment of the present invention, wherein FIG. 5A is a schematic and sectional view of a projection system lens barrel and FIG. 5B is a schematic view of the lens bottom face.

A gas supply port 18 and a gas discharging port 20 are provided in the neighborhood of the bottom-most lens of the projection system, that is, the lens 3 closest to the wafer, and the lens surface of the barrel 22 at the top of the projection system, facing the chamber ambience side, such that a clean gas is caused to flow. As shown in FIG. 5B, the gas supply port 18 is provided at one of lens side faces while the gas discharging port 20 is provided at the opposite lens side face, by which an effective gas flow is produced locally upon the lens surface. Particularly, plural gas supply ports and plural gas discharging ports may preferably be provided. On that occasion, a gas flows uniformly along the lens surface.

Further, in accordance with the shape of the lens (concave, convex or flat) and the curvature thereof, an optimum gas flowing angle at the gas supplying port may be selected to assure that the gas flows along the lens surface. Moreover, a cover 16 may be provided at the chamber ambience side of the lens, by which the influence or a surrounding gas flow or mixture thereof can be prevented.

A flow rate adjusting valve 19 may be used to adjust the flow rate and flow speed of the gas so that a laminar flow is produced. In this method, although the gas flow is only in one direction, the ambience at the lens surface can be effectively kept clean with use of only a limited flow rate of the gas. Therefore, the influence to the imaging performance or imaging position measurement is small. Further, there is an advantage that only a relatively narrow space is required. Moreover, since a gas flows only locally on the lens surface, in the case of a scan type exposure apparatus, the influence of resist gas diffusion due to the motion of the stage, for example, can be made small.

Between a projection optical system and a wafer, a probe light for focus position measurement passes. If there occurs non-uniformness of pressure or temperature in the ambience through which the probe light passes, it causes a measurement error. In consideration of this, usually, a gas of the same type as that of the chamber ambience is used. In this embodiment, however, since the gas flow is stable, a gas having a refractive index different from that of the ambience gas may be used. For example, in a case wherein the chamber ambience is atmosphere, a nitrogen gas may be caused to flow. When the barrel inside space is purged by the same type of gas, the same gas line may be used. If a different type of gas is to flow, a separate line is necessary. When the same gas line as that of the chamber ambience is used, since the gas must be sufficiently clean, gas purifying means such as a filter may be used, as required.

Figure 6:
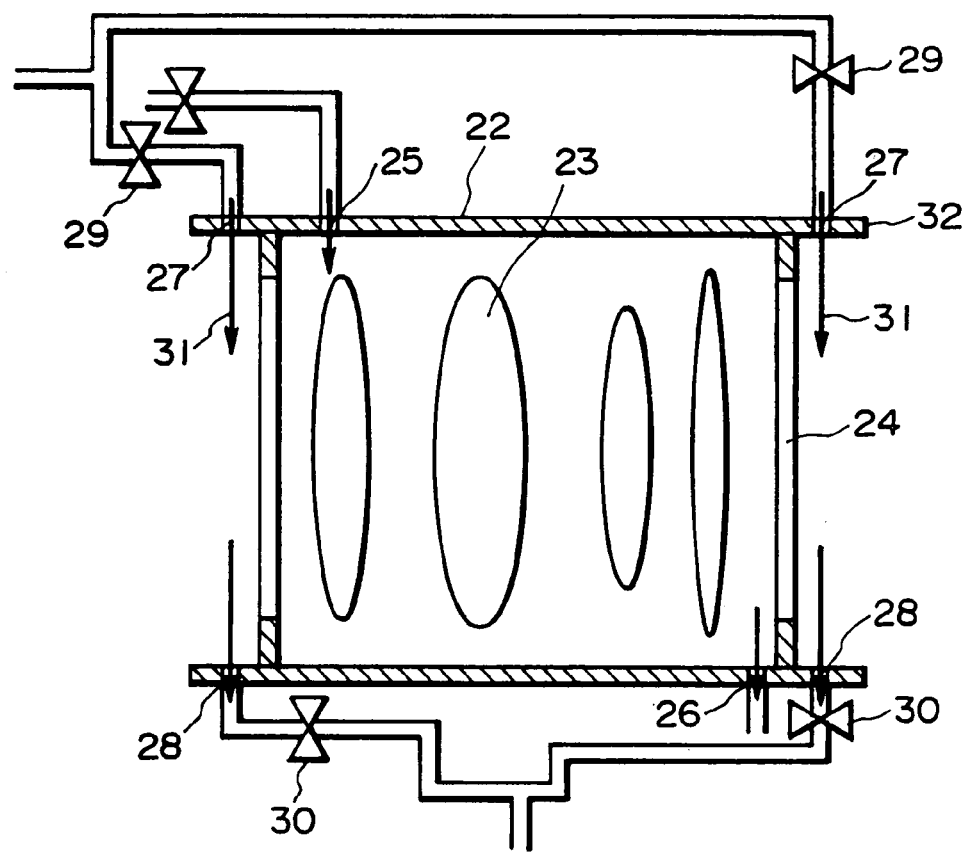
FIG. 6 is a schematic and sectional view of another example according to the third embodiment of the present invention.

This embodiment is applicable not only to a projection system but also to a portion of a separate optical system such as an illumination system, for example, as shown in FIG. 6. FIG. 6 is a schematic and sectional view of an optical system, wherein an optical system 23 is accommodated inside a barrel 22 being isolated from a surrounding ambience. Along the optical path, the ambience is isolated by means of a seal glass 24 which comprises a parallel flat plate. The inside of the barrel is purged by a clean gas, through a gas supply port 25 and a gas discharging port 26. In order that a clean gas flows along the surface of the seal glass 24, being in contact with the surrounding ambience, a gas supplying port 27 is provided at one side face while a gas discharging port 28 is provided at the opposite side face. By adjusting the flow rate and the pressure, a gas is caused to flow along the seal glass surface.

Like the third embodiment described above, the first and second embodiments described hereinbefore are applicable also to an optical system other than a projection system. Further, they can be applied not only to an exposure apparatus but also to an optical system which uses ultraviolet rays.

In accordance with the embodiments of the present invention described hereinbefore, a clean gas is efficiently supplied to the surface, or adjacent thereto, of the surface of an optical element isolated from a surrounding ambience, which surface faces the surrounding ambience. This assures that the surface of the optical element is kept clean, and adhesion of the depositions can be prevented effectively. Thus, contamination prevention, which is particularly suitably applicable to a semiconductor exposure apparatus, is accomplished.

Further, in accordance with the present invention, plural gas supply ports and plural gas discharging ports may be disposed revolutionally symmetrically, for example. Namely, a structure harmonized with the direction or the flow rate of a gas flow is chosen. This assures that the influence to the imaging performance is small and that the impurity concentration at the lens surface is lowered effectively.

Further, in accordance with the present invention, a gas supply port may be provided at one side face of the lens surface while a gas discharging port may be provided at the opposite side face thereof, to ensure that a gas flows along the lens surface. With this arrangement, a clean ambience is kept locally on the lens surface even with use of a very low rate of the gas flow.

Furthermore, when the present invention is applied to a scan type exposure apparatus, the influence of the scan motion of a mask or a stage can be reduced effectively.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   an optical system for directing light from a light source via a mask and for projecting a pattern of the mask onto a wafer;
   a barrel for accommodating therein at least a part of said optical system;
   a cover for suppressing diffusion of a gas in a space around an outermost one of surfaces of optical elements accommodated in said barrel;
   a supply system for supplying a gas into the space, said supply system having a supply port which faces to the outermost surface rather than in a direction perpendicular to a direction of an optical axis of said optical system; and
   an exhaust system for exhausting a gas from the space, said exhaust system having an exhaust port which is more distant from the outermost surface than is said supply port.

2. An apparatus according to claim 1 wherein said supply system comprises a plurality of said support ports, which are disposed in rotational symmetry with respect to the optical axis.

3. An apparatus according to claim 1 further comprising adjusting means for adjusting at least one of a flow rate and a pressure of the gas supplied by said supply system and a flow rate and a pressure of the gas exhausted by said exhaust system, in accordance with a state of operation of said apparatus.

4. An apparatus according to claim 1 further comprising temperature adjusting means for adjusting a temperature of the gas supplied by said supply system.

5. An apparatus according to claim 1 wherein the outermost surface corresponds to a last surface of a projection optical system for projecting the pattern of the mask onto the wafer.

6. An apparatus according to claim 1 wherein the outermost surface corresponds to a surface of an optical element in an illumination optical system for illuminating the mask.

7. An apparatus according to claim 1 wherein the gas supplied by said supply system is an inactive gas.

8. An apparatus according to claim 1 wherein the light is ultraviolet light.

9. A device manufacturing method comprising the steps of:
   exposing a wafer to a pattern by use of an exposure apparatus as recited in claim 1; and
   developing the exposed wafer.

10. An exposure apparatus comprising:
    an optical system for directing light from a light source via a mask and for projecting a pattern of the mask onto a wafer;
    a barrel for accommodating therein at least a part of said optical system;
    a supply system for supplying a gas into said barrel;
    an exhaust port for exhausting a gas from said barrel;
    a cover for suppressing diffusion of a gas in a space around an outermost one of surfaces of optical elements accommodated in said barrel; and a supply port for supplying, into the space, the gas exhausted from said barrel via said exhaust port.

11. An apparatus according to claim 10 wherein said apparatus has a plurality of said supply ports, which are disposed in rotational symmetry with respect to the optical axis.

12. An apparatus according to claim 10 further comprising adjusting means for adjusting at least one of a flow rate and a pressure of the gas supplied by said supply system, in accordance with a state of operation of said appartus.

13. An apparatus according to claim 10 further comprising temperature adjusting means for adjusting a temperature of the gas supplied by said supply system.

14. An apparatus according to claim 10 wherein the outermost surface corresponds to a last surface of a projection optical system for projecting the pattern of the mask onto the wafer.

15. An apparatus according to claim 10 wherein the outermost surface corresponds to a surface of an optical element in an illumination optical system for illuminating the mask.

16. An apparatus according to claim 10 wherein the gas supplied by said supply system is an inactive gas.

17. An apparatus according to claim 10 wherein the light is ultraviolet light.

18. A device manufacturing method comprising the steps of:
   exposing a wafer to a pattern by use of an exposure apparatus as recited in claim 10; and
   developing the exposed wafer.

19. An exposure apparatus comprising:
   an optical system for directing light from a light source via a mask and for projecting a pattern of the mask onto a wafer;
   a barrel for accommodating therein at least a part of said optical system;
   a cover for suppressing diffusion of a gas in a space around an outermost one of surfaces of optical elements accommodated in said barrel;
   a supply system for supplying a gas into the space, said supply system having a supply port which faces in a direction according to a shape of the outermost surface so that the gas flows along the outermost surface; and
   an exhaust system for exhausting, from the space, the gas having traveled along the outermost surface.

20. An apparatus according to claim 19 wherein said supply system comprises a plurality of said supply ports.

21. An apparatus according to claim 19 further comprising temperature adjusting means for adjusting a temperature of the gas supplied by said supply system.

22. An apparatus according to claim 19 wherein the outermost surface corresponds to a last surface of a projection optical system for projecting the pattern of the mask onto the wafer.

23. An apparatus according to claim 19 wherein the outermost surface corresponds to a surface of an optical element in an illumination optical system for illuminating the mask.

24. An apparatus according to claim 19 wherein the gas supplied by said supply system is an inactive gas.

25. An apparatus according to claim 19 wherein the light is ultraviolet light.

26. A device manufacturing method comprising the steps of:
   exposing a wafer to a pattern by use of an exposure apparatus as recited in claim 19; and
   developing the exposed wafer.

* * * * *

UNITED STATES PATENT AND TRADEMARK OFFICE
CERTIFICATE OF CORRECTION

PATENT NO. : 7,061,573 B2
APPLICATION NO. : 09/829915
DATED : June 13, 2006
INVENTOR(S) : Masami Tsukamoto It is certified that error appears in the above-identified patent and that said Letters Patent is hereby corrected as shown below:

COLUMN 1:
   Line 26, "structure that" should read -- structure in which --.

COLUMN 6:
   Line 48, "enables that" should read -- enablers -- and "is locally" should read -- to be locally --.
   Line 67, "ambience" should read -- ambience 10 --.

COLUMN 7:
   Line 8, "exposed to be" should read -- exposed to --.

COLUMN 8:
   Line 11, "flows form" should read -- flows from --.
   Line 12, "diffused of" should read -- diffused by the water surface to cause diffusion of --.

COLUMN 9:
   Line 14, "space" should read -- the space --.

COLUMN 10:
   Line 28, "claim 1" should read -- claim 1, --.
   Line 32, "claim 1" should read -- claim 1, --.
   Line 38, "claim 1" should read -- claim 1, --.
   Line 41, "claim 1" should read -- claim 1, --.
   Line 45, "claim 1" should read -- claim 1, --.
   Line 48, "claim 1" should read -- claim 1, --.
   Line 50, "claim 1" should read -- claim 1, --.

COLUMN 11:
   Line 3, "claim 10" should read -- claim 10, --.
   Line 7, "claim 10" should read -- claim 10, --.
   Line 10, "appartus." should read -- apparatus. --.
   Line 11, "claim 10" should read -- claim 10, --.
   Line 14, "claim 10" should read -- claim 10, --.
   Line 18, "claim 10" should read -- claim 10, --.
   Line 22, "claim 10" should read -- claim 10, --.
   Line 24, "claim 10" should read -- claim 10, --.

UNITED STATES PATENT AND TRADEMARK OFFICE
CERTIFICATE OF CORRECTION

PATENT NO. : 7,061,573 B2
APPLICATION NO. : 09/829915
DATED : June 13, 2006
INVENTOR(S) : Masami Tsukamoto It is certified that error appears in the above-identified patent and that said Letters Patent is hereby corrected as shown below:

COLUMN 12:
Line 11, "claim 19" should read -- claim 19, --.
Line 13, "claim 19" should read -- claim 19, --.
Line 16, "claim 19" should read -- claim 19, --.
Line 20, "claim 19" should read -- claim 19, --.
Line 24, "claim 19" should read -- claim 19, --.
Line 26, "claim 19" should read -- claim 19, --.

Signed and Sealed this

Second Day of January, 2007

JON W. DUDAS
*Director of the United States Patent and Trademark Office*